United States Patent [19]

Ohashi

[11] Patent Number: 4,916,706
[45] Date of Patent: Apr. 10, 1990

[54] EXCITATION SYSTEM FOR EXCITING A SEMICONDUCTOR LASER DEVICE

[75] Inventor: Tuyoshi Ohashi, Hashima, Japan

[73] Assignee: Brother Kogyo Kabushiki Kaisha, Aichi, Japan

[21] Appl. No.: 365,706

[22] Filed: Jun. 14, 1989

[30] Foreign Application Priority Data

Jun. 14, 1988 [JP] Japan .................. 63-146056
Dec. 20, 1988 [JP] Japan .................. 63-321666

[51] Int. Cl.$^4$ ............ H01L 27/14; H01L 31/00; H01L 31/14
[52] U.S. Cl. .................. 372/31; 372/25; 372/38
[58] Field of Search .......... 372/25, 31, 38, 44

[56] References Cited

U.S. PATENT DOCUMENTS

4,689,795  8/1987  Yoshimoto et al. ............ 372/31
4,768,198  8/1988  Deki ........................... 372/25

*Primary Examiner*—William L. Sikes
*Assistant Examiner*—Robert E. Wise
*Attorney, Agent, or Firm*—Oliff & Berridge

[57] ABSTRACT

An excitation system for exciting a semiconductor laser device used in a laser printer. An input terminal receives a modulated input signal having a level changed depending upon information. A bias signal is superimposed on the modulated input signal and the resultant signal is applied to the semiconductor laser device for exciting the same. A photodiode is provided to receive the laser beam emitted from the semiconductor laser device to thus detect the intensity of the laser beam. In response to the detected intensity of the laser beam, the level of the bias signal is adjusted so that a predetermined quantity of laser beam is emitted from the semiconductor laser device when the modulated input signal having a possible maximum level is inputted to the input terminal.

9 Claims, 6 Drawing Sheets

EXCITATION SYSTEM FOR EXCITING A SEMICONDUCTOR LASER DEVICE

BACKGROUND OF THE INVENTION

The present invention relates to an excitation system for exciting a semiconductor laser device, and more particularly to an excitation system for exciting a semiconductor laser device used in a laser printer.

One conventional modulation system includes a light source for generating a laser beam, an acoustooptic effect device, and a pinhole, in which the laser beam generated from the light source is polarized by the acoustooptic effect device and the resultant laser beam is subjected to modulation while passing it through the pinhole. Another conventional modulation system includes a semiconductor laser device, an auto power controller (APC), and a switching circuit for controlling flickering of the semiconductor laser to thus carries out a pulse width modulation.

However, the former modulation system is involved with problems such that the overall system is enlarged due to the provision of the acoustooptic effect device and the pinhole, and the system is liable to be affected by vibrations. The latter modulation system is also involved with problems such that the modulation cannot be performed with a high frequency because the modulating operation is performed in a discrete fashion.

In view of the problems involved with the conventional systems, researches and developments have recently be focused on the use of a semiconductor laser device with which an excitation signal of the semiconductor laser device is modulated to directly perform an amplitude modulation. This method, however, is not practically available due to the fact that properties of the semiconductor laser device change depending upon external factors, such as ambient temperature, and thus the modulation cannot be stably achieved.

SUMMARY OF THE INVENTION

The present invention has been made to solve the foregoing problems and it is an object of the invention to provide a modulation system which is compact in size and is not affected by vibrations.

Another object of the invention is to provide a modulation system enabling to perform modulation with a high frequency, yet enabling to provide a stable and continuous modulated output.

In order to achieve the above and other objects, there is provided an excitation system for exciting a semiconductor laser device, comprising an input terminal for receiving a modulated input signal having a level changed depending upon information, bias signal supplying circuit for supplying a bias signal having a level, an adder for adding the bias signal to the modulated input signal to provide an output signal having an added level, the output signal being applied to the semiconductor laser device for exciting the semiconductor laser device so that a laser beam is emitted therefrom, a quantity of the laser beam emitted from the semiconductor laser device being changed depending upon the level of the output signal, a sensor device for sensing the level of the output signal and providing an output status signal, bias signal adjusting circuit for adjusting the bias signal in response to the output status signal. The bias signal adjusting circuit adjusts the bias signal so that a predetermined quantity of laser beam is emitted from the semiconductor laser device when the modulated input signal having a possible maximum level is inputted to the input terminal.

In operation, the modulated input signal is added to the bias signal in the adder and the resultant output signal is applied to the semiconductor laser device for exciting the same. When correction of the bias signal is performed, a reference voltage is applied to the input terminal and the bias signal adjusting circuit adjusts the bias signal in response to the output status signal indicative of the intensity of the laser beam emitted from the semiconductor laser device.

With the excitation system according to the present invention, high frequency modulated output signal is obtained in continuous manner without being exerted by vibrations.

BRIEF DESCRIPTION OF THE DRAWINGS

The present invention will be described by way of nonlimitative examples, in which.

DETAILED DESCRIPTION OF THE PREFERRED EMBODIMENTS

Preferred embodiments of the present invention will now be described with reference to the accompanying drawings, in which an excitation system according to the invention is applied to a laser printer.

Figure 2:
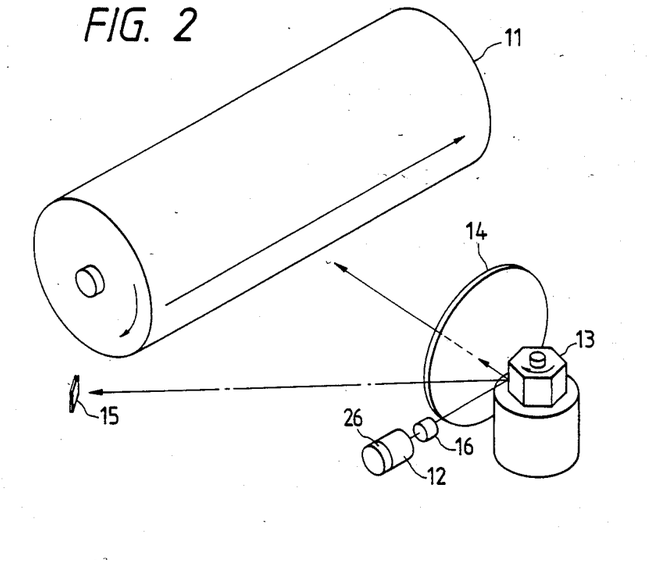
FIG. 2 is a perspective view showing an arrangement of an optical system.

An optical system of the laser printer will firstly be described while referring to FIG. 2. A photosensitive drum 11 is provided to be rotatable about its own axis. A peripheral surface of the drum 11 is adapted to be precharged by a charger (not shown). By irradiation of a laser beam onto the surface of the drum 11, a latent image is formed thereon. The laser beam is emitted from a semiconductor laser device 12 fixedly disposed in a predetermined position. The laser beam emitted from the semiconductor laser device 12 is subjected to beam form shaping by a collimator lens 16 to thereby output a collimated beam. The collimated beam is directed to a rotatable multi-faced polygon mirror 13 and is reflected thereupon. The reflected light is directed to the photosensitive drum 11. In accordance with the rotations of the mirror 13, the laser beam is moved on the photosensitive drum 11 in the axial direction of the drum 11 or a main scanning direction. The laser beam moves at a constant speed on the drum 11. In the path extending from the multifaceted polygon mirror 13 to the photosensitive drum 11, an F$\theta$ lens 14 is interposed, and a optical sensor 15 is disposed in a position adjacent one side face of the drum 11.

Figure 1:
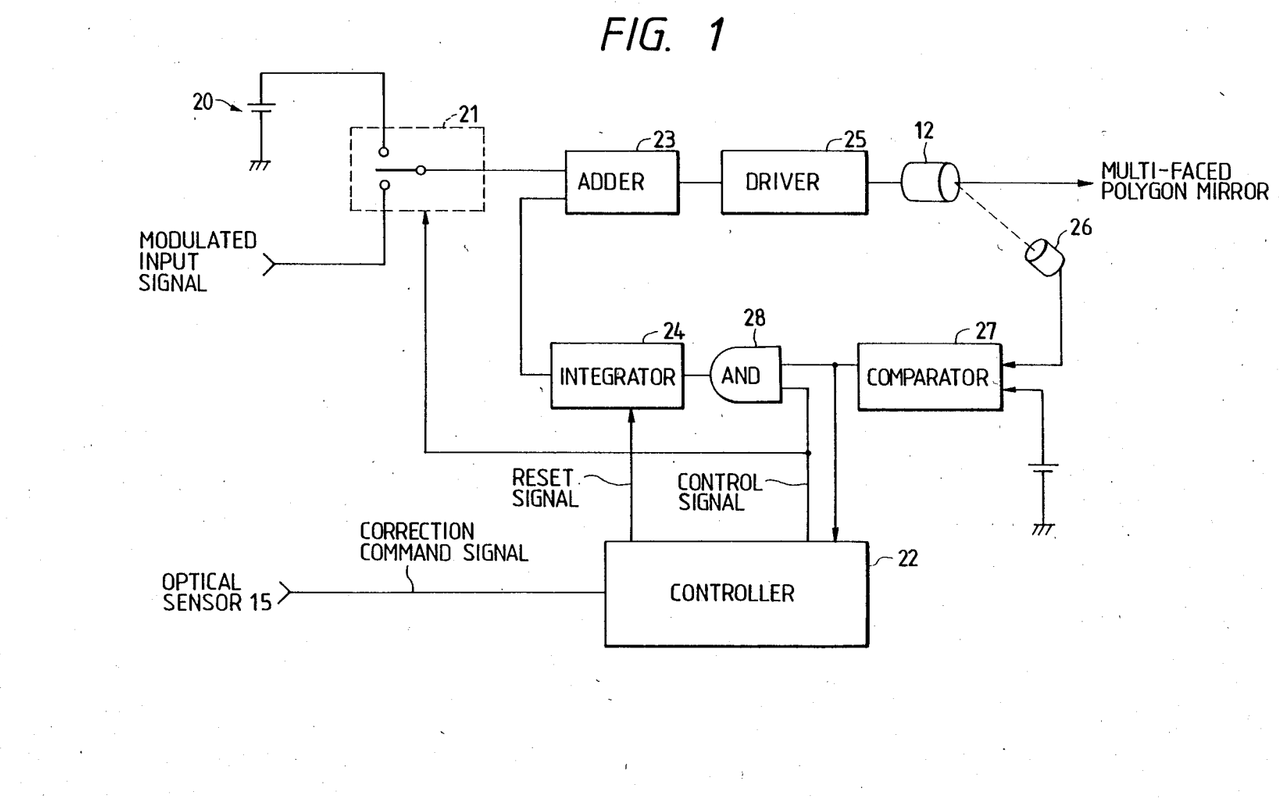
FIG. 1 is a block diagram showing an excitation system for exciting a semiconductor laser device according to one embodiment of the present invention.

Next, an excitation device for exciting the semiconductor laser device 12 will be described with reference to FIG. 1.

The semiconductor laser device 12 changes a quantity of light emitted therefrom in accordance with a modulated input signal. A changeover switch 21 has two input terminals to one of which the modulation input signal is applied. To another input terminal of the changeover switch 21, a reference voltage is applied by a constant voltage source 20. The reference voltage is set to a value equal to the possible maximum level of the modulated input signal. The changeover switch 21 is constituted with an FET, and is connected to a controller 22. Depending upon a control signal outputted from the controller 22, One of the two input terminals of the changeover switch 21 is selectively connected to the output terminal thereof.

The output terminal of the changeover switch 21 is connected to one input terminal of an adder 23. The adder 23 has another input terminal to which a bias voltage is applied from an integrator 24 (to be described later), in which the voltage developed on the output terminal of the changeover switch 21 and the bias voltage are added together and the resultant voltage is outputted from the output terminal. A driver 25 is connected to the output terminal of the adder 23, and the semiconductor laser device 12 is in turn connected to the output of the driver 25. The driver 25 supplies a current to the semiconductor laser device 12 corresponding to the voltage appearing at the output terminal of the adder 23. The semiconductor laser device 12 emits the laser beam in accordance with the current as supplied.

Figure 3:
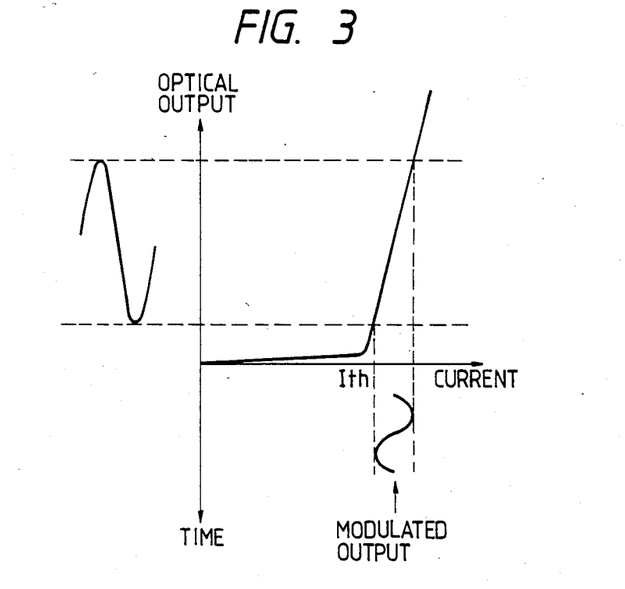
FIG. 3 is a diagram illustrating a property of the semiconductor laser device.

A current vs. optical output characteristic of the semiconductor laser device 12 is shown in FIG. 3. As can be appreciated therefrom, no laser beam is emitted from the semiconductor laser device 12 until the current flowing therein has reached a threshold value (Ith) while when the current flowing therein exceeds the threshold value (Ith) laser beam is emitted in proportion to the current flowed therein. If the current flowed therein is further increased to a level exceeding a maximum rated value, the semiconductor laser device 12 will be destroyed. In this embodiment, the maximum level that the laser beam is allowed to output is set to 60% of the maximum rated value, and this allowable maximum level is referred to as a maximum excitation laser output.

The laser beam outputted from the semiconductor laser device 12 is directed toward the rotating multifaced polygon mirror 13 and a part of the laser beam is directed toward photodiode 26 integrally provided with the semiconductor laser device 12. An optical current flowing in the photodiode 26 is converted to a voltage (hereinafter referred to as "measured voltage"). The photodiode 26 is connected to one input terminal of a comparator 27 and the measured voltage is applied thereto. The comparator 27 has another input terminal to which a comparison voltage is applied. The comparison voltage is equal to the measured voltage obtained when the semiconductor laser device 12 provides the maximum excitation laser output. The comparator 27 outputs a positive voltage when the measured voltage is lower than the comparison voltage, whereas the comparator 27 outputs zero (0) voltage when the measured voltage is equal to or higher than the comparison voltage.

The output terminal of the comparator 27 is connected to one input terminal of an AND gate 28. The AND gate 28 has another input terminal connected to a controller 22. The output of the AND gate 28 is connected to an integrator 24. The AND gate 27 selectively passes the voltage signal supplied from the comparator 27 in accordance with a control signal fed from the controller 22.

The integrator 24 performs integration of the voltage signal which has passed through the AND gate 28 and outputs the resultant voltage signal indicative of the bias voltage. This bias voltage is adjusted so as to correspond to the value Ith according to a prescribed operation of the integrator 24. The integrator 24 is reset upon receipt of a reset signal from the controller 22. The output terminal of the integrator 24 is connected to the adder 23, as described previously.

The controller 22 receives a correction command signal from an optical sensor 15 and produces the control signal and the reset signal based thereupon. The control signal remains at a predetermined positive voltage for a period of time running from the time instant when the correction command signal is inputted until the time instant when the voltage on the output terminal of the comparator 27 is initially rendered 0 volt. Other than this period of time, the control signal is at 0 volt. The reset signal remains at a predetermined voltage for a brief period of time after the input of the correction command signal. The reset signal is at 0 voltage other than this brief period of time. The correction command signal is generated when the laser beam is irradiated onto the optical sensor 15.

Operation of the circuit thus arranged will next be described.

The control signal is at 0 volt when the main scanning is being performed. At this time, the changeover switch 21 outputs a modulated input signal. This signal is added to the bias voltage supplied by the integrator 24 at the adder 23. The output of the adder 23 is inputted to the driver 25. The driver 25 excites the semiconductor laser device 12 with a current corresponding to the output voltage supplied by the adder 23. The laser beam emitted from the semiconductor laser device 12 is reflected from the rotating multi-faced polygon mirror 13 and enters the photosensitive drum 11 to thereby from a latent image thereon.

Figure 4:
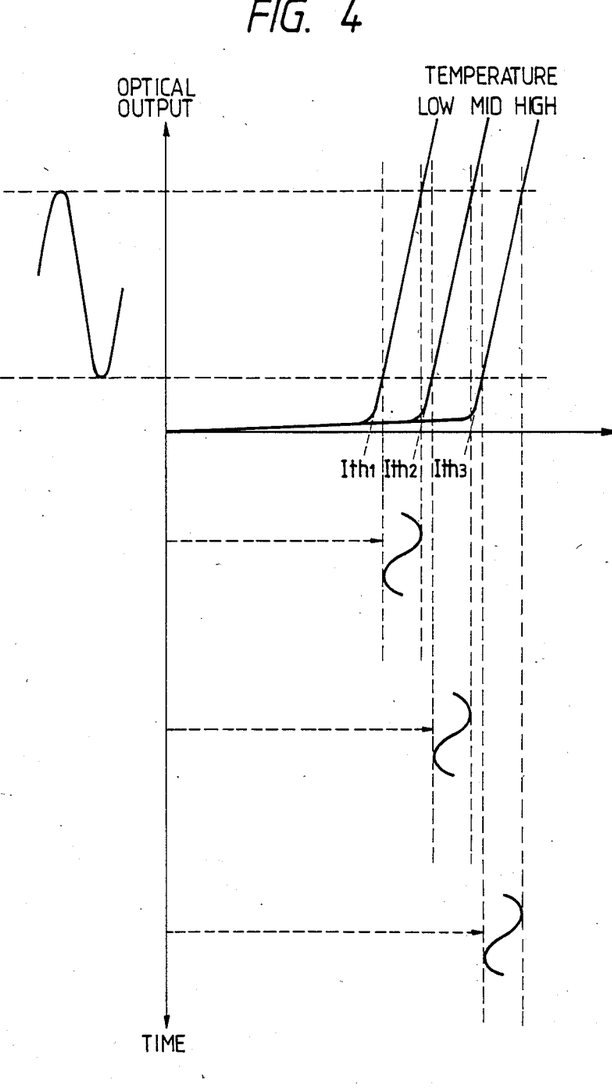
FIG. 4 is a diagram illustrating changes in the property of the semiconductor laser device.

Generally, the property of the semiconductor laser device 12 changes depending upon the change of an ambient temperature. As the ambient temperature changes, the value of Ith of the semiconductor laser device 12 changes as shown in FIG. 4. To compensate for the change of the ambient temperature, the correction of the bias voltage is performed every time when the main scanning has been completed.

Figure 5:
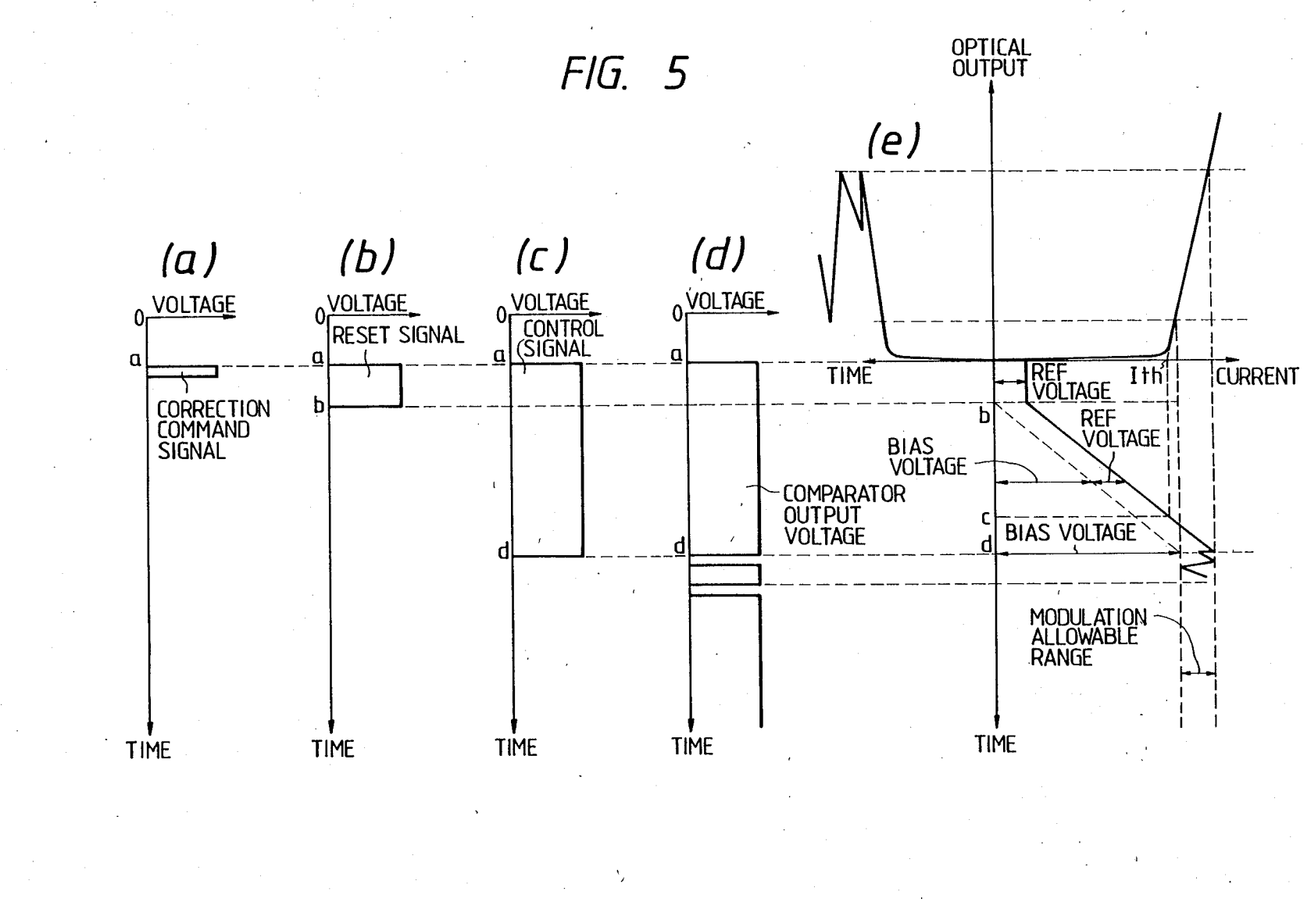
FIG. 5 is a timing chart illustrating operations of the embodiment shown in FIG. 1.

Upon completion of one main scanning, the laser beam is entered into the optical sensor 15 and the correction command signal is produced therefrom at time instant a as shown in FIG. 5(a). The production of the correction command signal causes the controller 22 to produce the reset signal as shown in FIG. 5(b). Then, the bias voltage is reset to 0 volt for a duration of the reset signal as shown in FIG. 5(e). At the same time, the controller 22 outputs the control signal having a predetermined voltage as shown in FIG. 5(c). In response to the control signal, the changeover switch 21 is changed over, and the reference voltage is applied to one input terminal of the adder 23. Further, the AND gate 28 allows the positive voltage outputted from the comparator 27 to pass therethrough. The positive voltage passed therethrough is applied to the integrator 24.

The adder 23 adds the reference voltage to the bias voltage outputted from the integrator 24 and in response to the resultant voltage the driver 25 excites the semiconductor laser device 12. Since at this moment the bias voltage has been reset and its initial value is 0 volt, the excitation current has not yet reached the threshold value Ith, so that no laser beam is emitted from the semiconductor laser device 12. Accordingly, the measured voltage is lower than the comparison voltage and thus the comparator 27 outputs the predetermined positive voltage. After the reset of the integrator 24 is released at time instant b in FIG. 5, the integrator 24 receives the positive voltage outputted from the comparator 27 through the AND gate 28 and performs integration of the voltage received. The resultant voltage from the integrator 24 is the bias voltage. After the reset is released, the bias voltage increases as the time elapses as shown in FIG. 5(e). When the excitation current corresponding to the sum of this bias voltage and the reference voltage exceeds the threshold current Ith at time instant c in FIG. 5, the semiconductor laser device 12 emits the laser beam and the output of the laser beam increases. At the same time, the measured voltage applied to the comparator 27 also increases. When the measured voltage exceeds the comparison voltage at the time instant d in FIG. 5, the output of the comparator 27 indicates 0 volt as shown in FIG. 5(d). The controller 22 detects the 0 volt in the output of the comparator 27 and renders the control signal at 0 volt. Then, the changeover switch 21 is changed over and the modulated input signal is applied to the adder 23. By the operation of the AND gate 28, the voltage is no longer applied to the integrator 24 and the bias voltage is remained the same until the subsequent correction command signal is produced.

The above described processing for the correction of the bias voltage starts at the time when the laser beam enters the optical sensor 15 and terminates before the laser beam is applied to the photosensitive drum 11. Thereafter, the subsequent main scanning is taken place based upon the newly set bias voltage.

Figure 6:
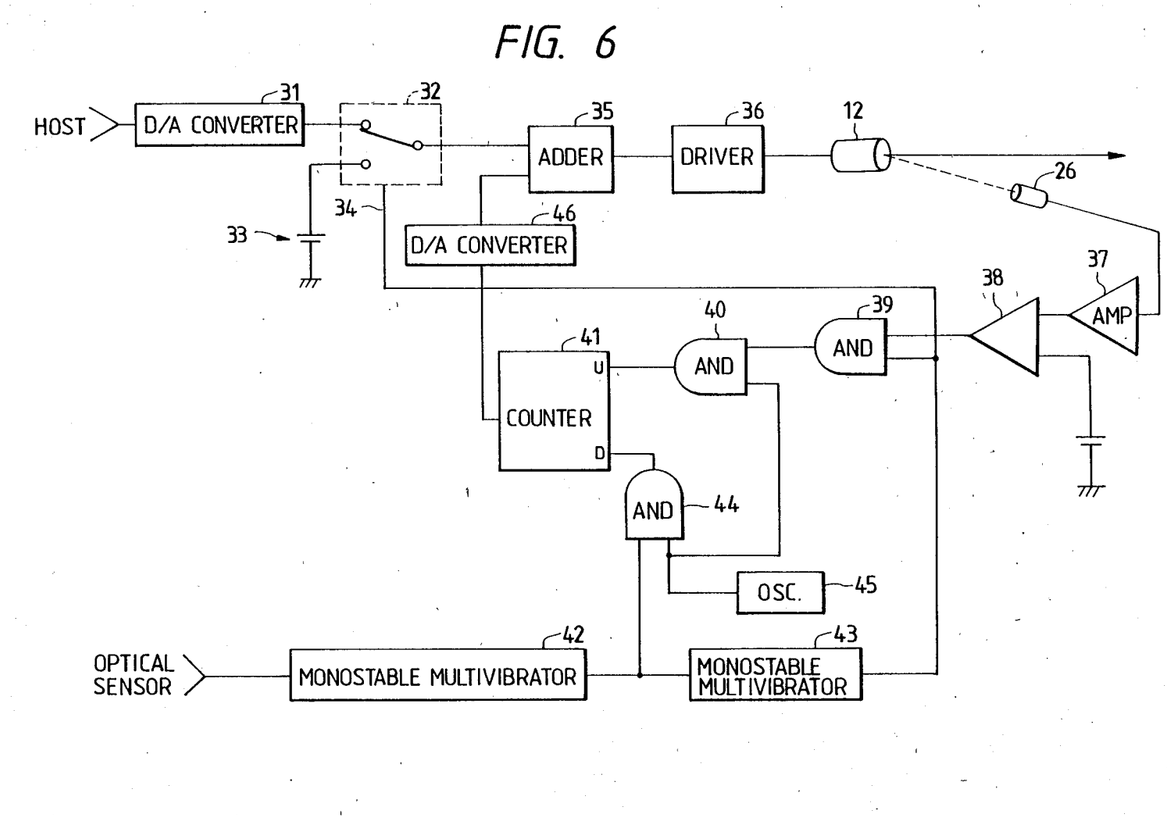
FIG. 6 is a block diagram showing an excitation system for exciting a semiconductor laser device according to another embodiment of the present invention.

A second embodiment of the excitation system according to the invention will be described with reference to FIG. 6. The excitation system according to the second embodiment is also applied to the optical system of the laser printer similar to the first embodiment.

Like the first embodiment, a semiconductor laser device 12 changes a quantity of light emitted therefrom in accordance with a modulated input signal. The modulated input signal is in the form of a digital signal and is inputted externally of the excitation system. The modulated input signal is applied to the input terminal of a digital-to-analog converter (hereinafter referred to as "D/A converter") to convert the digital signal to an analog signal. The modulated input signal converted to the analog signal is applied to one input of a changeover switch 32. The changeover switch 32 has another input terminal to which a reference voltage is applied by a constant voltage source 33. The reference voltage is set to a value corresponding to the possible maximum level of the modulated input signal. The changeover switch 32 is constituted with an FET which electrically connects one of the selected input terminal to the output terminal of the changeover switch 32 in accordance with a control signal 34.

The output terminal of the changeover switch 32 is connected to one input terminal of an adder 35. The adder has another input terminal to which a bias voltage is applied, in which the voltage appearing at the output terminal of the changeover switch 32 and the bias voltage are added together and the resultant signal is outputted to the output terminal of the adder 35. To the output terminal of the adder 35, a driver 36 is connected to which the semiconductor laser device 12 is in turn connected. The driver 36 applies a current to the semiconductor laser device 12 corresponding to the voltage appearing at the output terminal of the adder 35.

The semiconductor laser device 12 emits a laser beam in accordance with the current flowed therethrough. The semiconductor laser device 12 has the same current vs. optical output characteristic as that shown in FIG. 1. In this embodiment, the maximum level that the laser beam is outputted is also set to 60% of the maximum rated value.

The laser beam outputted from the semiconductor laser device 12 is directed toward a rotating multi-faced polygon mirror 13 shown in FIG. 2 and a part of the laser beam is directed toward a photodiode 26 integrally provided with the semiconductor laser device 12. An optical current flowing in the photodiode 26 is converted to a voltage (measured voltage), and the resultant voltage is applied to an amplifier 37. The output terminal of the amplifier 37 is connected to one input terminal of a comparator 38. The comparator 38 has another input terminal to which a comparison voltage is applied. The comparison voltage is equal to the measured voltage obtained when the semiconductor laser device 12 outputs the maximum excitation laser beam. The comparator 27 outputs a positive voltage when the measured voltage is lower than the comparison voltage, whereas the comparator 27 outputs zero (0) voltage when the measured voltage is equal to or higher than the comparison voltage.

The output of the comparator 38 is connected to one input terminal of an AND gate 39 which has an output terminal connected to one input terminal of another AND gate 40. The output terminal of the AND gate 40 is connected to a trigger input terminal (U) of a counter 41 for up count.

A signal, i.e. a correction command signal, outputted from an optical sensor 15 is applied to the trigger input terminal of a monostable multivibrator 42. The monostable multivibrator 42 outputs a high level voltage on its output terminal at the time when the laser beam is irradiated onto the optical sensor 15 and the voltage is rendered at a low level after a predetermined period of time T1 has been elapsed. The output of the multivibrator 42 is connected to both the trigger input terminal of another monostable multivibrator 43 and one input terminal of an AND gate 44. The monostable multivibrator 43 raises the voltage on its output terminal to a high level at the time when the voltage on the trigger input terminal is rendered high, after elapsing a predetermined period of time T2 (T2=T1*2) the voltage is again rendered low. The output terminal of the multivibrator 43 is connected to both another input terminal of the AND gate 39 and the changeover switch 32. The output of the multivibrator 43 serves as a control signal 34 with respect to the changeover switch 32.

An oscillator 45 is connected to another input terminals of the AND gates 40 and 44. The oscillator 45 generates pulse trains having a period of T1/16. The output terminal of the AND gate 44 is connected to a count down trigger input terminal (D) of the counter 41. The output terminal of the counter 41 is connected through a D/A converter 46 to another input terminal of the adder 35.

The operation of the above-described circuit will be described.

The control signal is at 0 volt when the main scanning is performed. At this time, the changeover switch 32 outputs a modulated input signal converted to an analog signal by the D/A converter 31. This output is added to the bias voltage outputted by the D/A converter 46 at the adder 35. The output of the adder 35 is inputted to the driver 36. The driver 35 operates to excite the semiconductor laser device 12 with a current corresponding to the output voltage supplied from the adder 35. The laser beam emitted from the semiconductor laser device 12 is reflected from the rotating multi-faced polygon mirror 13 and enters the photosensitive drum 11 to thereby form a latent image thereon.

Since the semiconductor laser device 12 has the property as shown in FIG. 4 as described before, the bias voltage correction is performed in a manner described below.

Figure 7:
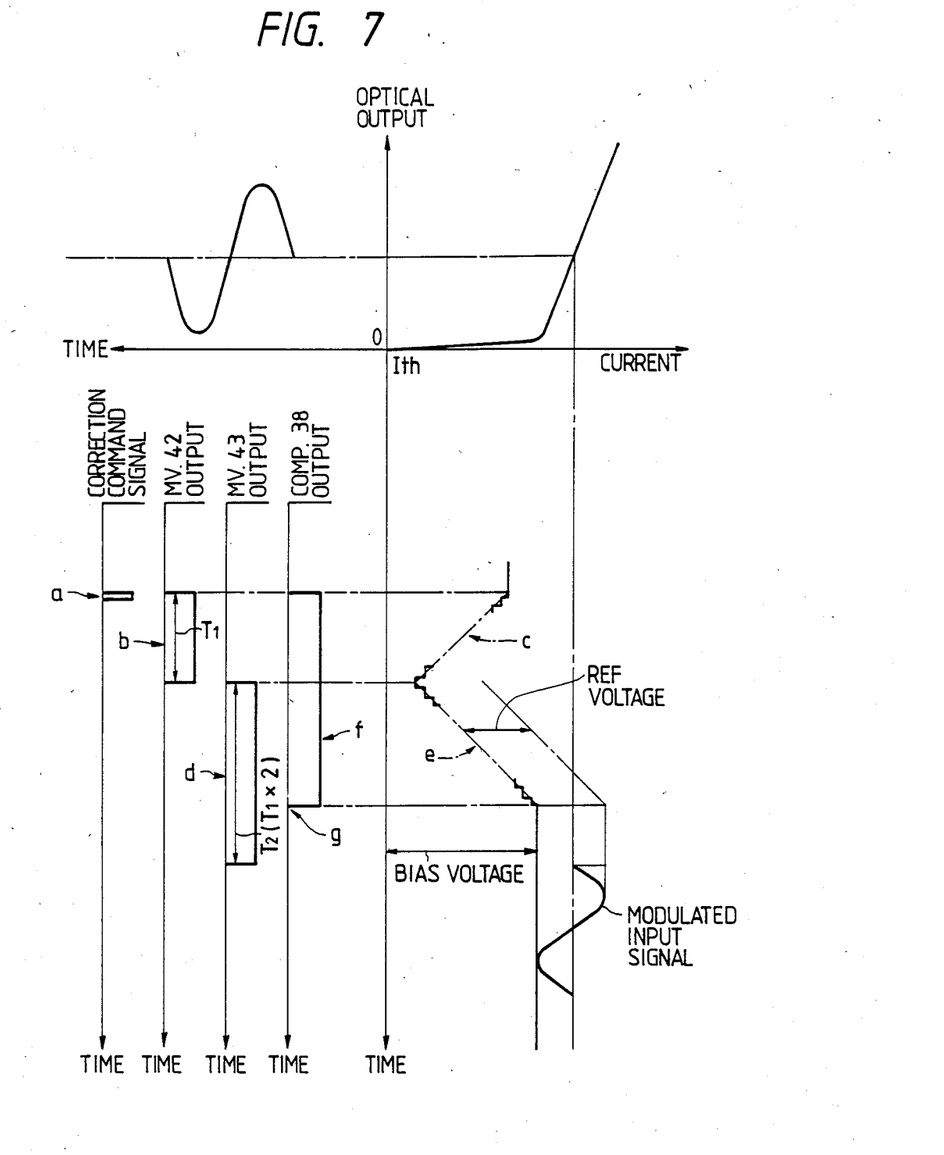
FIG. 7 is a timing chart illustrating operations of the embodiment shown in FIG. 6.

Upon completion of one main scanning, the laser beam reflected upon the polygon mirror 13 is entered into the optical sensor 15 which in turn produces a pulse as shown in FIG. 7(a). This pulse is referred to as a correction command signal and is applied to the monostable multivibrator 42. The multivibrator 42 outputs a high level voltage for a period of time T1 from the rising edge of the correction command signal as shown in FIG. 7(b). Therefore, the AND gate 44 permits the pulse trains outputted from the oscillator 45 to pass therethrough for the duration at which the output of the multivibrator 42 indicates the high level. During this period of time, the oscillator 45 produces 16 pulses, so that the count value of the counter 41 is decremented 16 and thus the bias voltage outputted from the D/A converter 46 decreases in staircase fashion as shown in FIG. 7(c). When the voltage at the output terminal of the multivibrator 42 is lowered, the output of the monostable multivibrator 43 is raised high for the duration of T2. Accordingly, the signal 34 is raised high and the changeover switch 32 outputs a reference signal as shown in FIG. 7(d).

In this state, the bias voltage has been decreased 16 steps, so that the signal amplified by the amplifier 37 does not normally exceed the comparison voltage. As a result, the comparator 38 output a high level voltage as shown in FIG. 7(f). As described above, since the output of the multivibrator 43 is at a high level, the output of the AND gate 39 is at a high level and thus the pulse trains outputted from the oscillator 45 pass through the AND gate 40. Accordingly, the count value of the counter 41 is incremented. That is, the bias voltage increases in staircase fashion as shown in FIG. 7(e). In accordance with the increase of the bias voltage, the intensity of the laser beam outputted from the semiconductor laser device 12 increases and the voltage outputted from the photodiode 26 increases correspondingly. When the voltage applied to the comparator 38 has reached the comparison voltage, the output of the comparator 38 is rendered low as shown in FIG. 7(g). Then, both the AND gates 39 and 40 are dialed and no pulses are delivered to the counter 41, so that the incrementing operation of the counter 41 is halted and the value immediately before this state is maintained thereat. The count value maintained at the counter 41 is subjected to digital-to-analog conversion and the resultant voltage is set as an optimum bias voltage at this moment.

During the period of time T2, the oscillator 45 produces 32 pulses. According to the arrangement of the second embodiment, it is possible to correct the voltage within a range of 16 steps in both the positive and negative directions at maximum with respect to the bias voltage immediately before the occurrence of the correction command signal. Thereafter, the changeover switch 32 is again changed over and the modulated input signal is outputted. Meanwhile, the correcting period of time (T1+T2) is set to be shorter than a period of time from the occurrence of the correction command signal until the subsequent line scanning is commenced.

As described, according to the arrangement of the second embodiment, while it is possible to correct the bias voltage over 16 steps in both the positive and negative directions at maximum in the converter 46, one time correction would not suffice to comply with the case where the power source is powered on or an optimum bias voltage largely fluctuates due to external causes. However, since corrections over 16 steps in both the positive and negative directions can be performed, the image formed by the laser printer is satisfactory from the visual standpoint. The subsequent correction of the bias voltage is performed based upon the previous correction, thus the correction can be accomplished substantially perfectly.

Although the present invention has been described with reference to specific embodiments, it would be apparent for a person skilled in the art that a variety of changes and modifications made be made without departing from the scope and spirit of the invention. For example, it is not necessary to set the reference voltage to the possible maximum level of the modulated input signal but a different voltage is applicable by adjusting the comparison voltage. Further, in the first embodiment, although the bias signal adjusting means includes the integrator, it is possible to replace it with a storage device, such as read-only memory, in which a conversion table is stored and the bias voltage is determined while referring to the conversion table. Further, the present invention is not only applicable to the laser printer but also to a transmitter in a synchronized communication system.

What is claimed is:

1. An excitation system for exciting a semiconductor laser device, comprising:
   an input terminal for receiving a modulated input signal having a level changed depending upon information;
   bias signal supplying means for supplying a bias signal having a level;
   an adder for adding the bias signal to the modulated input signal to provide an output signal having an added level, the output signal being applied to the semiconductor laser device for exciting the semiconductor laser device so that a laser beam is emitted therefrom, a quantity of the laser beam emitted from the semiconductor laser device being changed depending upon the level of the output signal;
   sensing means for sensing the level of the output signal and providing an output status signal; and
   bias signal adjusting means for adjusting the bias signal in response to the output status signal.

2. An excitation system according to claim 1, wherein said bias signal adjusting means adjusts the level of the bias signal so that a predetermined quantity of laser beam is emitted from the semiconductor laser device when the modulated input signal having a possible maximum level is inputted to said input terminal.

3. An excitation system according to claim 2, wherein the adjustment of the bias signal is performed at every predetermined period of time.

4. An excitation system according to claim 3, wherein said bias signal adjusting means comprises:
   a constant voltage source connected to said adder for applying a constant voltage corresponding to the possible maximum level of the modulated input signal:
   a comparator for comparing the output status signal with a reference signal and outputting a first signal when the output status signal is equal to or larger than the reference signal and a second signal when the output status signal is smaller than the reference signal; and
   an integrator for integrating the second signal outputted from said comparator and providing an adjusted bias signal, the adjusted bias signal being applied to said adder, wherein the integration of the second signal is performed until the first signal is outputted from the comparator.

5. An excitation system according to claim 4, wherein the reference signal is set to a value equal to a possible maximum level of the output signal.

6. An excitation system according to claim 5, further comprising a changeover switch selectively connecting one of said constant voltage source and said input terminal.

7. An excitation system according to claim 3, wherein said bias signal adjusting means comprises:
   a constant voltage source connected to said adder for applying a constant voltage corresponding to the possible maximum level of the modulated input signal;
   a comparator for comparing the output status signal with a reference signal and outputting a first signal when the output status signal is equal to or larger than the reference signal and a second signal when the output status signal is smaller than the reference signal; and
   an up/down counter having an up count terminal and a down count terminal, said up/down counter being decremented a predetermined number and incremented in response to the second signal outputted from said comparator, the incremental counting being performed until the first signal is outputted from the comparator, said up/down counter providing count value as a result of decremental and incremental countings; and
   a digital-to-analog converter receiving the count value from said up/down counter for converting the count value to an analog signal indicative of an adjusted bias signal, the adjusted bias signal being applied to said adder.

8. An excitation system according to claim 7, wherein the reference signal is set to a value equal to a possible maximum level of the output signal.

9. An excitation system according to claim 8, further comprising a changeover switch selectively connecting one of said constant voltage source and said input terminal.

* * * * *